United States Patent
Wang

(10) Patent No.: US 6,423,906 B2
(45) Date of Patent: Jul. 23, 2002

(54) SURFACE MOUNT PACKAGE FOR LONG LEAD DEVICES

(75) Inventor: Bily Wang, Hsin-Chu (TW)

(73) Assignee: Youngtek Electronics Corp., Hsin-Chu (TW)

(*) Notice: Subject to any disclaimer, the term of this patent is extended or adjusted under 35 U.S.C. 154(b) by 45 days.

(21) Appl. No.: 09/949,558

(22) Filed: Sep. 10, 2001

Related U.S. Application Data

(63) Continuation of application No. 09/399,039, filed on Sep. 21, 1999.

(51) Int. Cl.[7] .......................... H01R 12/04; H05K 1/11
(52) U.S. Cl. .................. 174/260; 174/258; 174/261; 174/262; 174/266; 361/760; 361/719; 361/774; 361/803; 257/698
(58) Field of Search ............................. 174/262, 260, 174/250, 258, 261, 263, 52.1, 266; 361/760, 803, 719, 761, 774, 791, 767, 768, 771, 306.1, 808, 782, 811; 29/843, 842, 592.1, 840, 830, 832, 837, 839, 852; 257/696, 692, 697, 698; 439/83

(56) References Cited

U.S. PATENT DOCUMENTS

| | | | | |
|---|---|---|---|---|
| 2,754,486 A | * | 7/1956 | Hathorn | 439/55 |
| 3,991,347 A | * | 11/1976 | Hollyday | 317/760 |
| 4,303,798 A | * | 12/1981 | Paunovic | 174/257 |
| 5,160,270 A | * | 11/1992 | Reymond | 439/70 |
| 5,180,440 A | * | 1/1993 | Siegel et al. | 136/230 |
| 5,203,077 A | * | 4/1993 | Reddy | 29/840 |
| 5,319,159 A | * | 6/1994 | Watanabe et al. | 174/262 |
| 5,398,165 A | * | 3/1995 | Niinou | 361/774 |
| 5,699,613 A | * | 12/1997 | Chong et al. | 29/852 |
| 5,726,862 A | * | 3/1998 | Huynh et al. | 361/773 |
| 5,953,214 A | * | 9/1999 | Dranchak et al. | 361/767 |
| 6,071,756 A | * | 6/2000 | Sines et al. | 438/107 |

* cited by examiner

Primary Examiner—Jeffrey Gaffin
Assistant Examiner—J B Patel
(74) Attorney, Agent, or Firm—H. C. Lin

(57) ABSTRACT

Via holes are plated through the substrate of a surface mount package. The leads of an electronic device is inserted in the plated-through via holes. The bottom of the plated through metal is enlarged as pads to provide reliable soldering surfaces to a motherboard. Upon heating the leads are soldered to the walls of the plated through via holes. Alternatively, the leads can be folded before inserting into the plated-through via holes.

2 Claims, 5 Drawing Sheets

SURFACE MOUNT PACKAGE FOR LONG LEAD DEVICES

This application is a continuation of Ser. No. 09/399039, filed Sep. 21, 1999.

BACKGROUND OF THE INVENTION (1) Field of the Invention

This invention relates to package for electronic devices, in particular to a surface mount package.

(2) Background of the Invention

Many kinds of electronic devices such as capacitors, resistors have long leads. With the advent of printed circuits, it is desirable to use surface mount packages for the devices for easy connection to the printed circuit board.

FIG. 1A shows top view of a conventional package for a typical long lead device. A substrate 20 has two via holes 24 through which the leads of a device (not shown) can extend. FIG. 1B shows the side view of section A—A' of FIG. 1A. The substrate 20 has two grooves 22 outside the via holes 24. When the leads of a device is inserted through the via holes, the leads are bent outward against the grooves 22 and recessed in the grooves 22 as shown in FIG. 1C. FIG. 1D shows the side view of the package with a device 10 inserted through the package. The two leads 12 of the device 10 are inserted through the substrate 20 and bent outward. Because of the recessed grooves 22, the bottom ends of the bent leads 12 are flush with the bottom of the substrate 20. Thus the bottom surface of the package is flat for surface mounting to a printed circuit board.

However the rounded ends of the leads do not provide a big contact area for soldering to the printed circuit board, the soldering reliability. Although the ends of the leads 12 may be crimped flat to increase the contact area, the increase in soldering area is limited.

SUMMARY OF THE INVENTION

An object of this invention is provide a package for surface mounting of long-lead electronic devices. Another object of this invention is to provide a big-area bonding pad for improving the soldering reliability of a surface mount package.

These objects are achieved by using plated through via holes in the substrate of the surface-mount package. The leads of the device are inserted into the plated through via holes. The bottom of the plated through metal is enlarged as a pad to provide a large reliable surface mounting surface. Upon heating the leads are soldered to the walls of the plated through holes. Alternatively, the leads of leads can be folded before inserting into the plated through holes.

DETAILED DESCRIPTION OF THE INVENTION

Figure 1A:
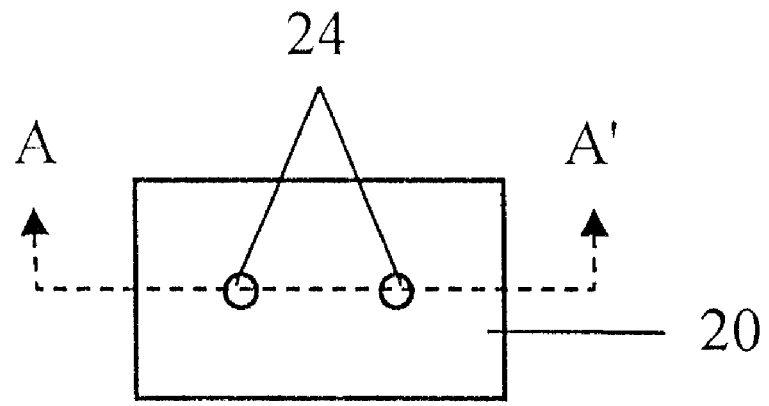
FIG. 1A shows a top view of a prior art surface mount package.
Figure 1B:
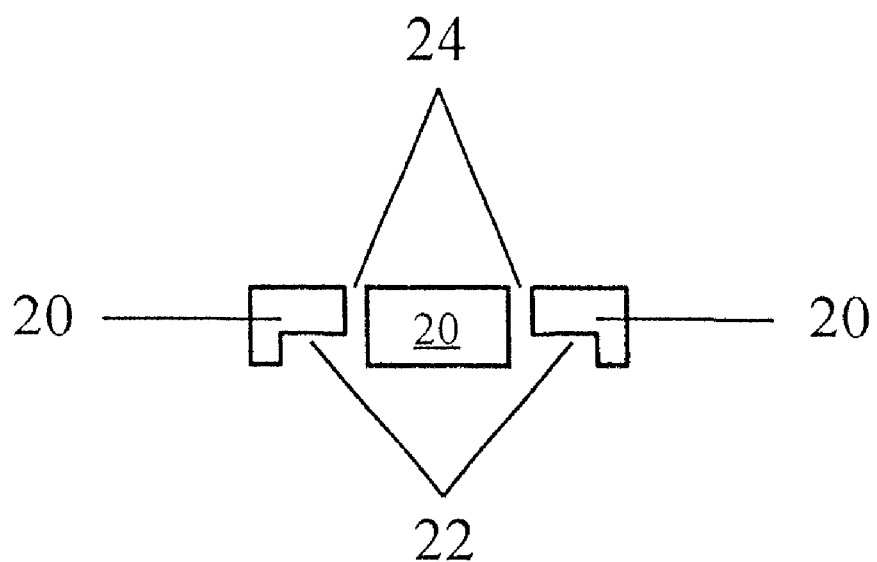
FIG. 1B shows a section view of the package shown in FIG. 1A.
Figure 1C:
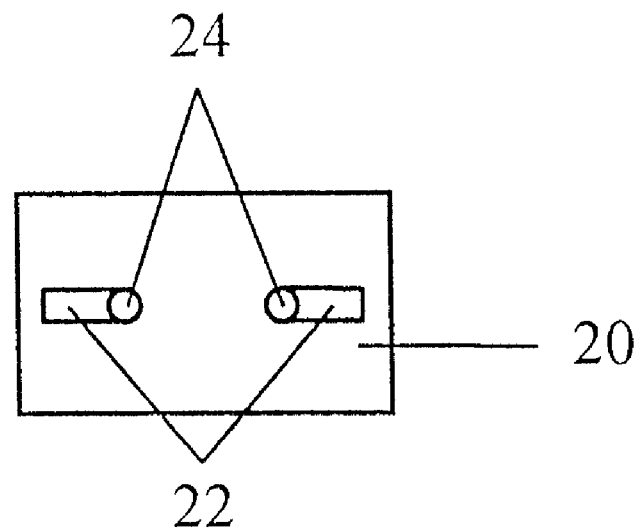
FIG. 1C shows the bottom view of the package shown in FIG. 1A.
Figure 1D:
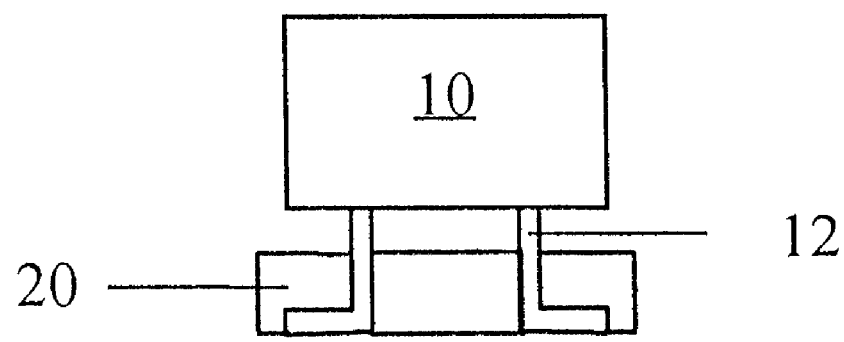
FIG. 1D shows the side view of the package when a long-lead device is mounted.
Figure 2A:
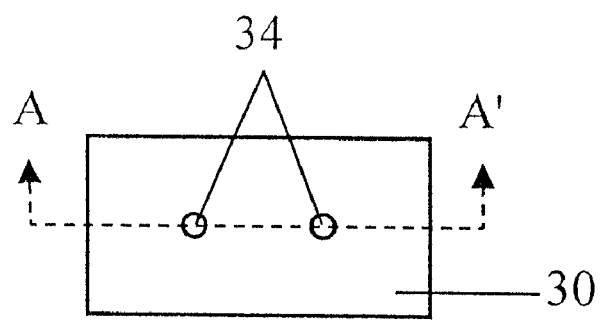
FIG. 2A shows the top view of the package of the present invention.
Figure 2B:
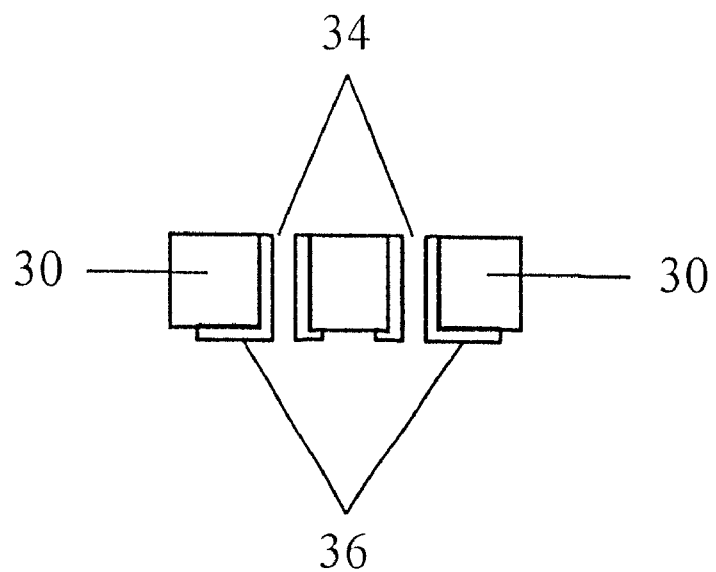
FIG. 2B shows the section view of the package shown in FIG. 2A.
Figure 2C:
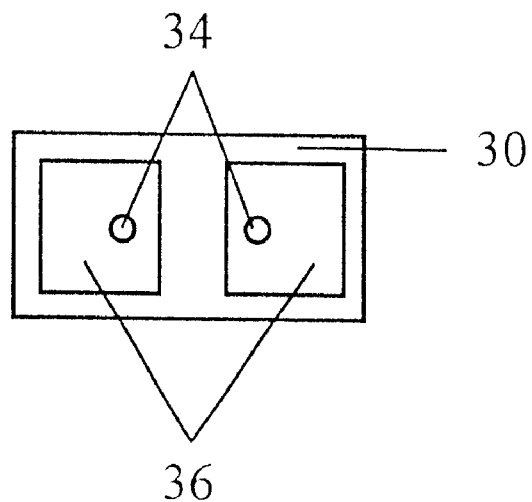
FIG. 2C shown the bottom view of the package shown in FIG. 2A.

The top view of package of the present invention is shown in FIG. 2A. The insulating substrate 30 of the package has two via holes 34. The via holes are plated through with soldering material 36 as shown in the section view of the package FIG. 2B. The bottom of the plated-through metal 36 adheres to the bottom of the substrate 30 and is enlarged into flat pads as shown in FIG. 2C. These enlarged bottom pads provide reliable soldering contacts for surface mounting to a mother-board.

Figure 2D:
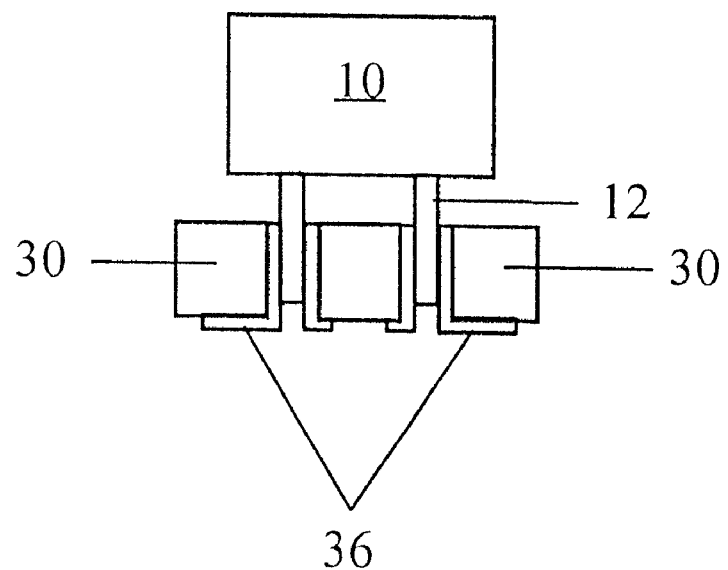
FIG. 2D shows the side view of the package with a long-lead device mounted.

FIG. 2D shows the side view of the package with the leads 12 of a long-lead device 10 inserted into the plated-through via holes of the substrate 30. Upon heating, the soldering material of plated-through holes forms an intimate soldered contact with the long leads 12. Meanwhile, the enlarged bottom pads 36 of the plated-through via holes can form intimate soldered contacts with a motherboard (not shown).

Figure 2E:
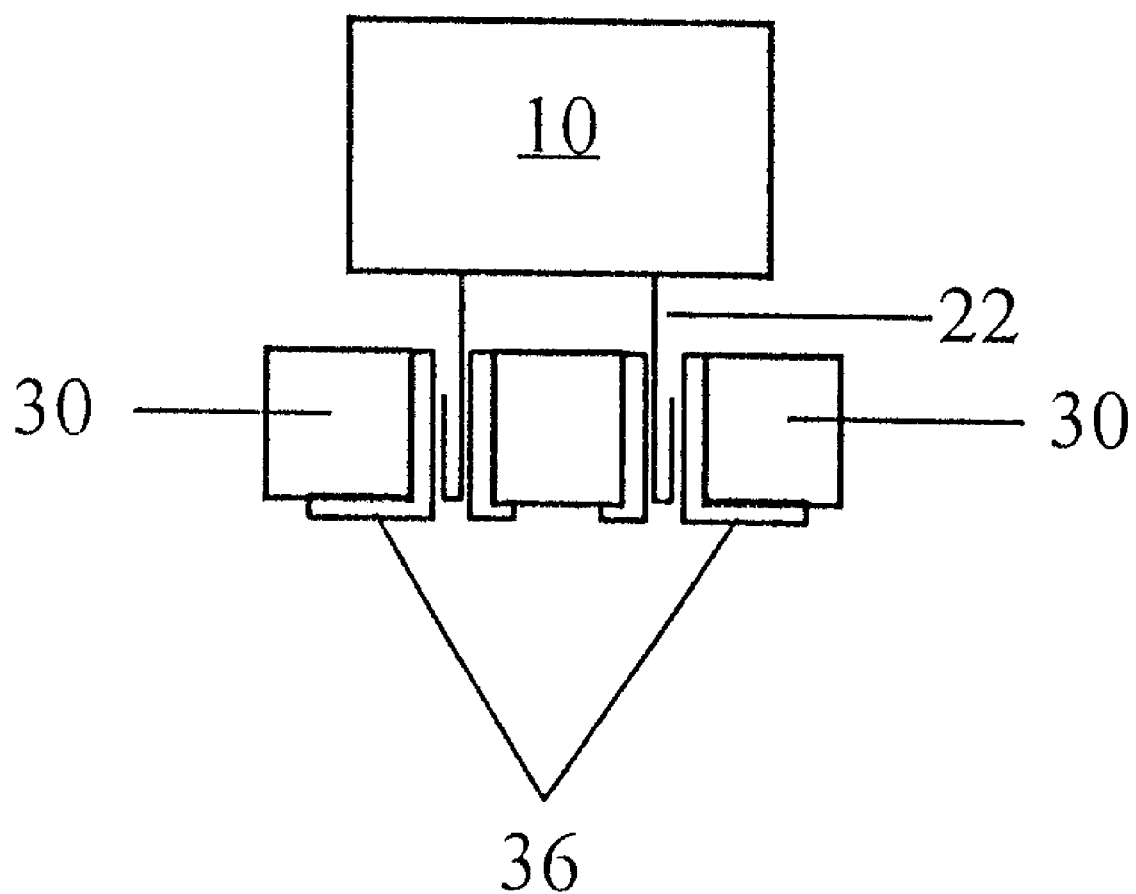

The soldering material 36 for the via hole can be a tin-lead alloy, which melts upon heating. If the long leads of the device 10 is very thin, the leads 22 of the device 10 can be folded inside the plated-through via hole 36 as shown in FIG. 2E. Folding provides more contact area of the leads 22 with the plated-through 36.

While the preferred embodiment of the invention has been described, it will be apparent to those skilled in the art that various modifications may be made in the embodiment for the surface mount package without departing from the spirit of the present invention. Such modifications are all within the scope of this invention.

What is claimed is:

1. A surface-mounted package for an electronic device with at least one long lead wire, comprising:

an electronic device with at least one long lead wire;

an insulated substrate;

at least one bottom contact for surface-mounting said substrate on and making connection to a motherboard;

at least one via hole through said substrate for said lead wire to be inserted to a depth no deeper than the thickness of the substrate;

soldering material plating along the wall of said via hole for soldering to said lead wire; and an extension from said soldering material for connection to said bottom contact.

2. A surface mount package as described in claim 1, wherein said lead wire is folded back inside said via hole.

* * * * *